US008339206B2

(12) United States Patent
Sawada

(10) Patent No.: US 8,339,206 B2
(45) Date of Patent: Dec. 25, 2012

(54) PLL

(75) Inventor: Masaru Sawada, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/310,069

(22) Filed: Dec. 2, 2011

(65) Prior Publication Data
US 2012/0218049 A1 Aug. 30, 2012

(30) Foreign Application Priority Data

Feb. 24, 2011 (JP) ................................. 2011-037832

(51) Int. Cl.
*H03L 7/00* (2006.01)
(52) U.S. Cl. ................................. 331/10; 331/11; 331/25
(58) Field of Classification Search .................. 331/1 R, 331/2, 10, 11, 12, 25, 44, 46, 47; 327/156–158
See application file for complete search history.

(56) References Cited

U.S. PATENT DOCUMENTS

| | | | |
|---|---|---|---|
| 6,043,695 A * | 3/2000 | O'Sullivan | 327/157 |
| 6,222,421 B1 | 4/2001 | Kiyose | |
| 6,515,520 B2 | 2/2003 | Kiyose | |
| 6,621,354 B1 * | 9/2003 | Kornblum et al. | 331/14 |
| 6,724,265 B2 * | 4/2004 | Humphreys | 331/17 |
| 6,864,729 B2 * | 3/2005 | Aoki et al. | 327/157 |
| 7,151,413 B2 * | 12/2006 | Lin | 331/11 |
| 2007/0146025 A1 * | 6/2007 | Huang et al. | 327/156 |
| 2007/0229129 A1 | 10/2007 | Nakagawa | |
| 2009/0245450 A1 * | 10/2009 | Miura et al. | 375/376 |
| 2011/0304365 A1 * | 12/2011 | Bunch | 327/157 |

FOREIGN PATENT DOCUMENTS

| | | |
|---|---|---|
| JP | 2000-188542 A | 7/2000 |
| JP | 2007-266935 A | 10/2007 |

* cited by examiner

*Primary Examiner* — Joseph Chang
*Assistant Examiner* — Jeffrey Shin
(74) *Attorney, Agent, or Firm* — Fujitsu Patent Center

(57) ABSTRACT

A PLL includes: a charge-pump equalizer which has a plurality of charge pumps generating charge currents according to phase-difference signals, each being generated by delaying the phase-difference signal by different times, adds and outputs the charge currents generated by the charge pumps; a replica circuit, having ideal characteristics of a loop filter and a voltage controlled oscillator, which input a digital value having phase difference of the phase-difference signals, and generates a replica output according to the ideal characteristics; and a coefficient generating circuit which smoothes correlation values of the difference signals and the phase-difference signals to generate charge pump coefficients, and negatively feeds back the same to the plurality of charge pumps. The charge pumps generate the charge currents each having current values corresponding to the charge pump coefficients.

11 Claims, 7 Drawing Sheets

PLL

CROSS-REFERENCE TO RELATED APPLICATION

This application is based upon and claims the benefit of priority of the prior Japanese Patent Application No. 2011-037832, filed on Feb. 24, 2011, the entire contents of which are incorporated herein by reference.

FIELD

The embodiments discussed herein relate to a PLL.

BACKGROUND

A PLL is equipped in an RF transmitter/receiver as a synthesizer which generates a high-frequency clock being phase-synthesized to a reference clock. An RF (high frequency) transmitter/receiver requires a local oscillation clock with low noise, which is stable in high-frequency (for example, GHz) bands. A PLL synthesizer for generating such a local oscillation clock is required to generate a high-frequency clock with less jitter, of which the frequency is stable.

A PLL synthesizer includes, a phase frequency comparator which performs a comparison of phases of a reference clock and a feedback clock fed back from an output clock, a charge-pump circuit which generates current according to the phase comparison result, a loop filter which generates a control voltage according to the current of the charge-pump circuit, a voltage controlled oscillator which oscillates by a frequency according to the control voltage, and a divider which divides an output clock generated by the voltage controlled oscillator.

Related descriptions are disclosed in Japanese patent laid-open publications No. 2000-188542, and No. 2007-266935.

For equipping a PLL synthesizer on a CMOS high-frequency LSI, it is desired, for reducing power consumption and area, to reduce the current of the charge-pump circuit and the R/C constant of the loop filter.

However, if the current of the charge pump is reduced, unbalance between a push current as a positive charge current and a pull current as a negative charge current increases, and, because of the resistance or capacitance of the loop filter being reduced, a control voltage generated by the loop filter varies widely, thus causing more jitter of the output clock (fluctuation of the phase). Also, on a chip where an LSI is formed, characteristics of the loop filter or the voltage oscillator become non-linear characteristics differing from ideal characteristics thereof, and thus cause the jitter of the output clock.

Since an output clock of a PLL synthesizer equipped on an RF transmitter/receiver is used as a local clock for a down-converting mixer, increase of jitter of the output clock, which is phase fluctuation, is not permissible.

Further, if loop gain of a PLL loop decreases due to a limitation to the current of the charge-pump circuit, fluctuation of characteristics of the loop filter or the voltage controlled oscillator is likely to influence the PLL loop characteristic. Since loop filter and voltage controlled oscillator formed in a chip have characteristics differing from the ideal characteristics thereof, influence thereby to the PLL loop characteristic becomes unignorable.

SUMMARY

A PLL includes: a phase comparator which compares phases of a reference clock and a feedback clock and outputs phase-difference signal; a charge-pump equalizer, which includes a plurality of charge pumps, the plurality of charge pumps generating charge currents according to phase-difference signals, each being generated by delaying the phase-difference signal by different times, adds the charge currents generated by the plurality of charge pumps, and outputs the added charge current; a loop filter which generates a control voltage according to the charge current; a voltage controlled oscillator which generates an output clock having a frequency corresponding to the control voltage; a divider which divides the output clock to generate the feedback clock; a replica circuit, which includes a digital filter, the digital filter having ideal characteristics of the loop filter and the voltage controlled oscillator, inputting in a phase-difference digital value having phase difference of the phase-difference signal, and generating a replica output according to the ideal characteristics, and outputs a difference signal between the replica output and an ideal output; and a coefficient generating circuit which smoothes correlation values of the difference signal and the phase-difference signal to generate charge pump coefficients, and negatively feeds back the charge pump coefficients to the plurality of charge pumps respectively, wherein the plurality of charge pumps generate the charge currents each having current value corresponding to each of the charge pump coefficients.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
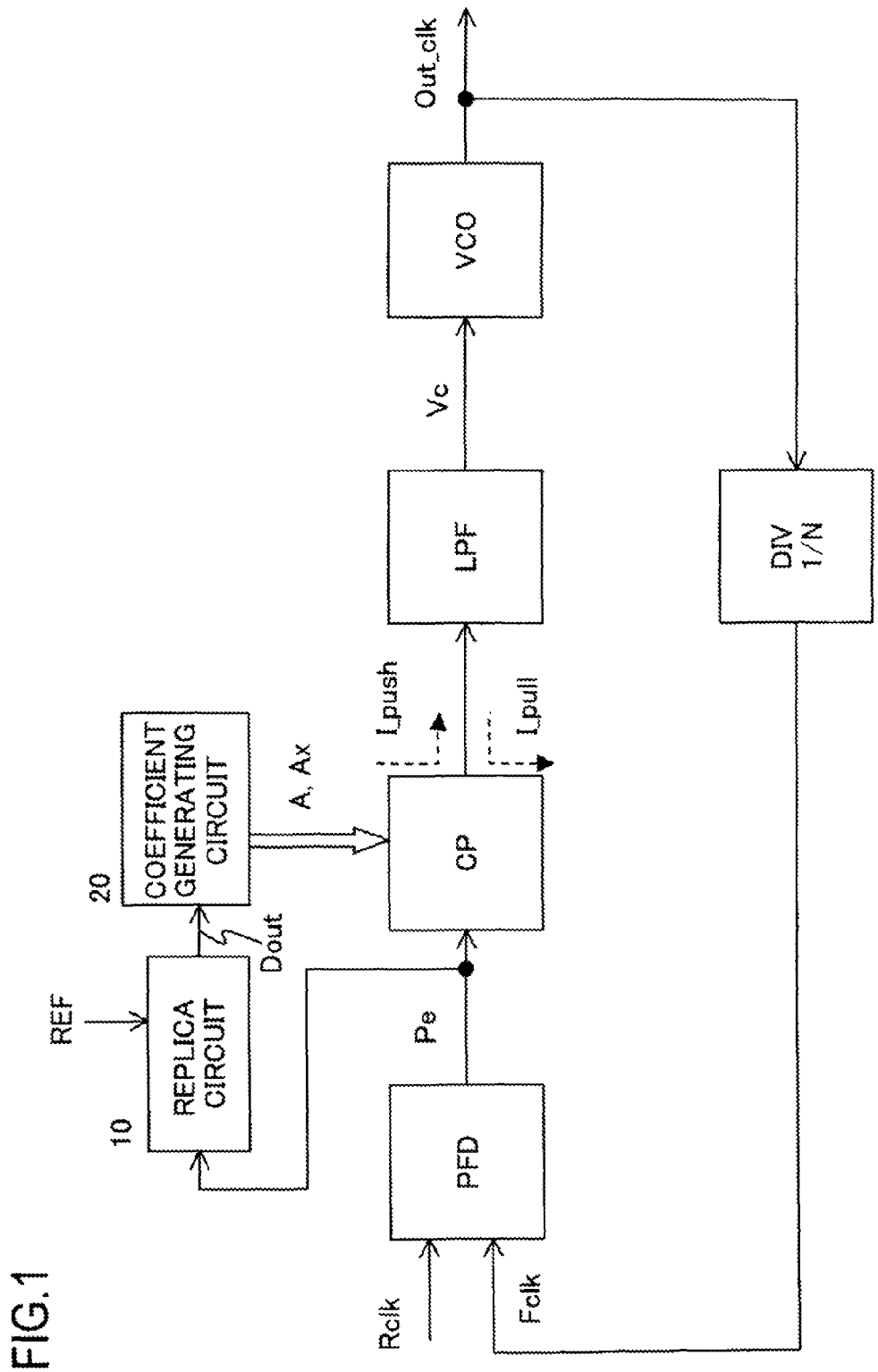
FIG. 1 is a schematic circuit diagram of a PLL in accordance with an embodiment.

FIG. 1 is a schematic circuit diagram of a PLL in accordance with the present embodiment. The PLL in FIG. 1 includes a phase frequency comparator PFD which performs a phase comparison between a reference clock Rclk and a feedback clock Fclk fed back from an output clock Out_clk, a charge-pump circuit CP which generates positive or negative currents I_push and I_pull according to a phase-difference signal Pe, a loop filter LPF which generates a control voltage Vc according to the currents I_push, I_pull of the charge-pump circuit CP, a voltage controlled oscillator VCO which oscillates at a frequency according to the control voltage Vc, and a divider DIV which divides, with a ratio of 1/N, an output clock Out_clk generated by the voltage controlled oscillator VCO.

The charge pump CP has a characteristic such as to convert a pulse width indicating the phase difference of the phase-difference signal Pe into a current value, such that if the pulse width*K=current value, for the characteristic being K. Also, the loop filter LPF has a characteristic such as to generate the control voltage Vc on the basis of the current value generated by the charge pump CP, such that the characteristic is represented as S function, Vc=lpf(S). Then, the voltage controlled oscillator VCO generates an output clock having an LC oscillating frequency, of which the capacitance value C is variably controlled by the control voltage Vc, and the characteristic thereof is a function 1/S, indicating an integrator.

The phase-difference signal Pe includes a first phase-difference signal having a first value during the phase difference time in a first case, in which phase of the reference clock Rclk leads or retards behind the phase of the feedback clock Fclk, and a second phase-difference signal having a second value during the phase difference time in a second case, in which the phase relation is opposite to the first case. Then, as described below, the charge-pump circuit CP generates the positive charge current I_push, according to the first phase-difference signal, and the negative charge current I_pull, according to the second phase-difference signal.

The loop filter LPF is an RC circuit, as described below, and charges the positive and negative charge currents I_push, I_pull in the capacitor, so as to generate the control voltage Vc. For example, if the positive charge current I_push provided from a power supply voltage is generated, the control voltage Vc rises, and if the negative charge current I_pull pulled down to the ground is generated, the control voltage Vc drops. Then, the voltage controlled oscillator VCO, includes, for example, an LC oscillating circuit, the capacitance value of the LC oscillating circuit is controlled by the control voltage Vc so as to increase or decrease, and thus the oscillating frequency is variably controlled.

In the embodiment hereafter, in Case(A), in which the phase of the feedback clock Fck leads the phase of the reference clock Rclk, the charge pump CP generates the positive charge current I_push, the control voltage Vc rises, and the voltage controlled oscillator VCO decreases the frequency of the output clock Out_clk to make the phase of the feedback clock Fclk retard; and on the contrary, in Case(B), in which the phase of the feedback clock Fck retards behind the phase of the reference clock Rclk, the charge pump CP generates the negative charge current I_pull, the control voltage Vc drops, and the voltage controlled oscillator VCO increases the frequency of the output clock Out_clk to make the phase of the feedback clock Fclk lead. Or, the relation of Cases may be reversed.

Figure 2A:
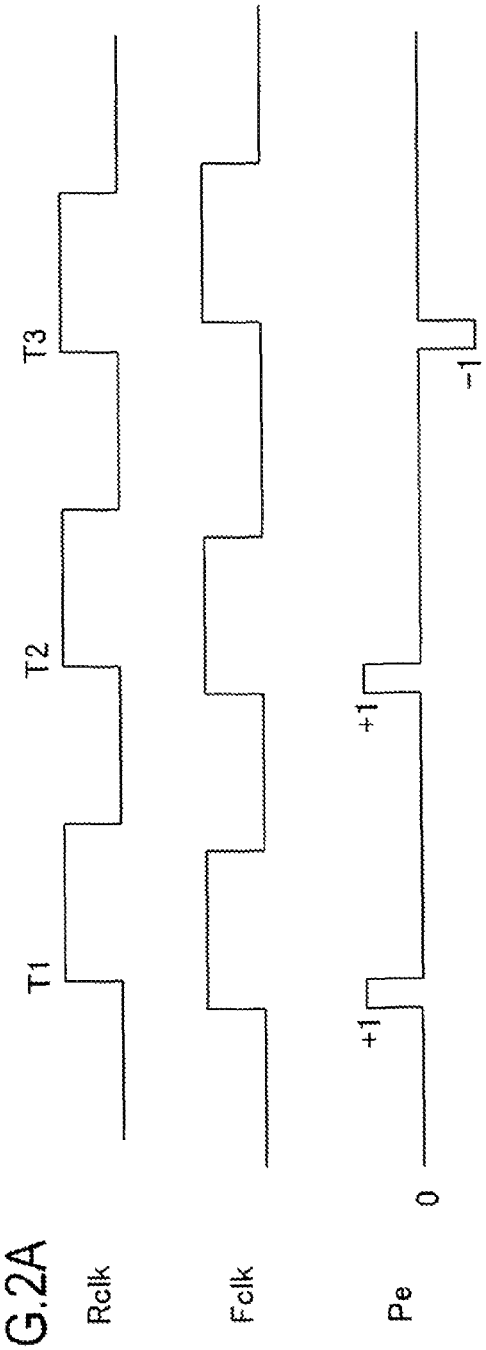
FIGS. 2A, 2B illustrate examples of a phase relations between a feedback clock and a reference clock, and of a phase-difference signal.
Figure 2B:
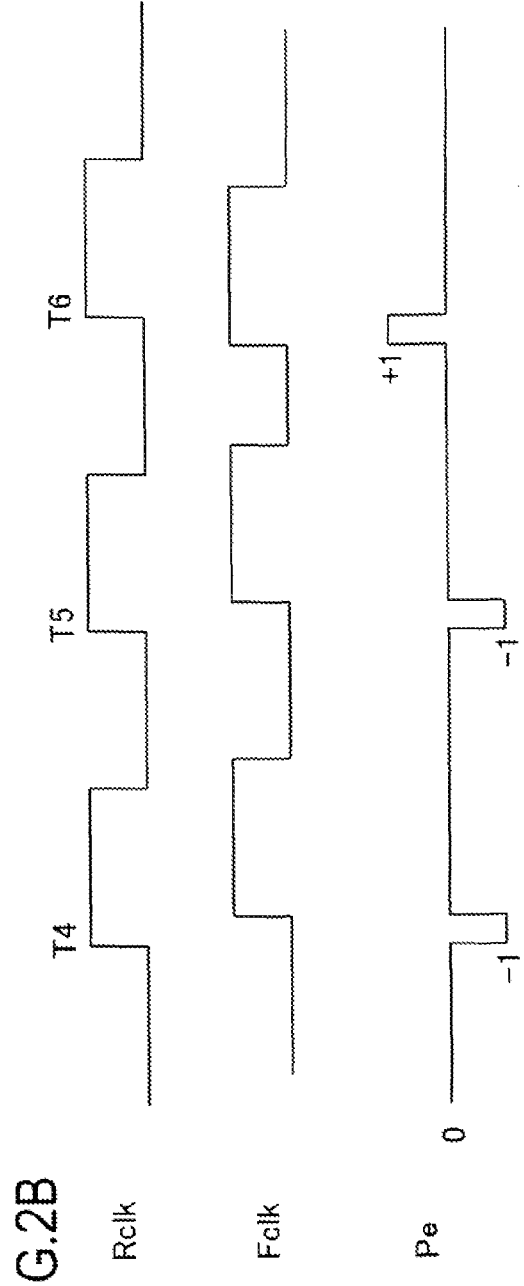

FIGS. 2A, 2B illustrate phase relations between the above feedback clock and the reference clock, and an example of the phase-difference signal generated by the phase comparator PFD. FIG. 2A illustrates an example in which the phase of the feedback clock Fck leads the phase of the reference clock Rclk at times T1, T2. In this case, the phase-difference signal Pe becomes the first phase-difference signal having value "+1" through the phase difference periods in sync with the reference clock Rclk at the times T1, T2. As a result, as described above, the charge pump CP generates the positive charge current I_push, the control voltage Vc rises, and the voltage controlled oscillator VCO decreases the frequency of the output clock Out_clk. By this control, at a time T3, the phase of the feedback clock Fclk retards behind the phase of the reference clock Rclk, and the phase-difference signal Pe becomes the second phase-difference signal having a value "−1" through the phase difference period.

On the other hand, FIG. 2B illustrates an example in which the phase of feedback clock Fck retards behind the phase of the reference clock Rclk at times T4, T5. In this case, the phase-difference signal Pe becomes the second phase-difference signal having a value "−1" through the phase difference periods in sync with reference clock at the times T4, T5. As a result, as described above, the charge pump CP generates the negative charge current I_pull, the control voltage Vc falls, and the voltage controlled oscillator VCO increases the frequency of the output clock Out_clk. By this control, at a time T6, the phase of the feedback clock Fclk leads the phase of the reference clock Rclk, and the phase-difference signal Pe becomes the first phase-difference signal having a value "+1" through the phase difference period.

Figure 3:
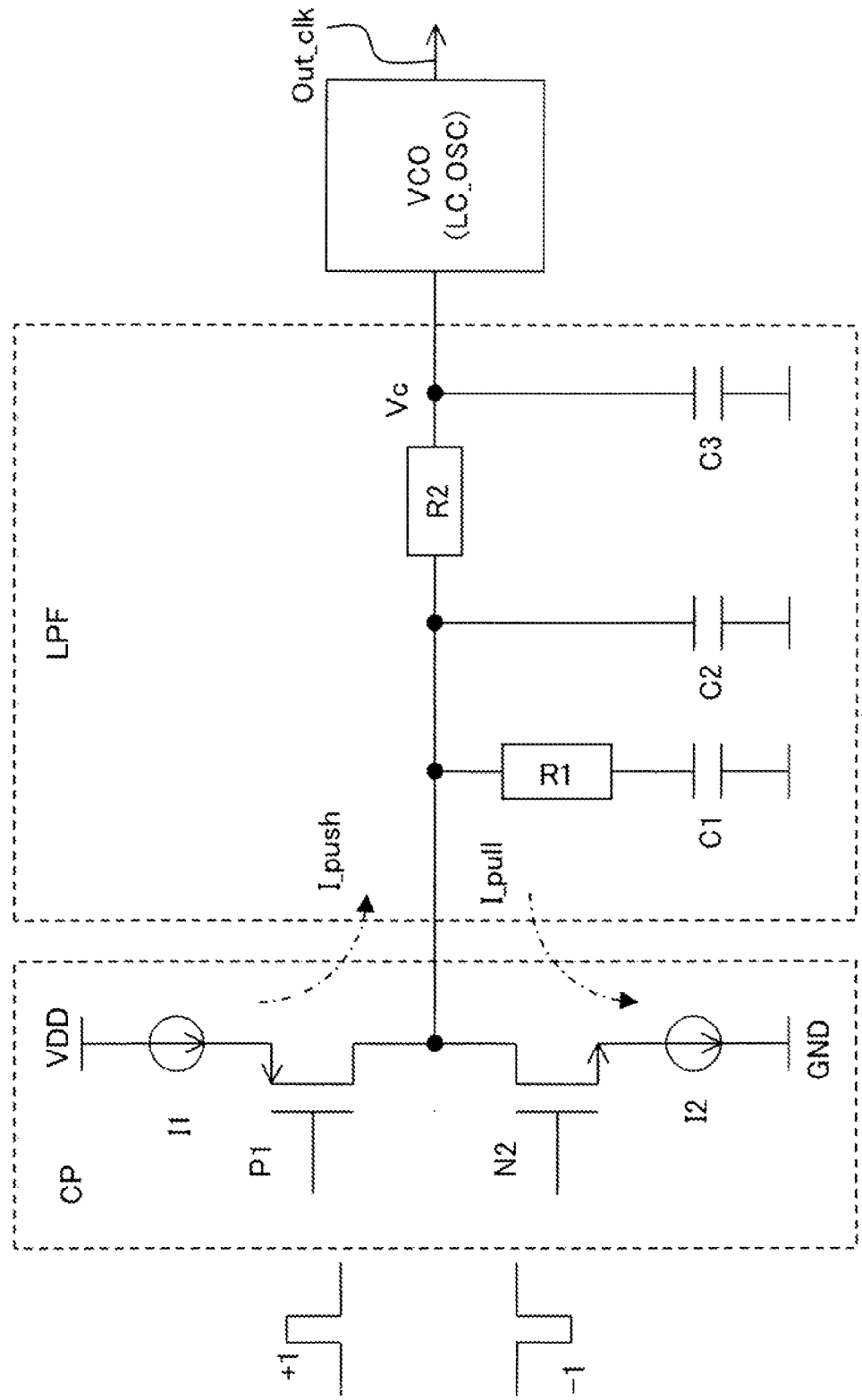
FIG. 3 is a circuit diagram of an example of a charge-pump circuit CP and a loop filter LPF.

FIG. 3 is a circuit diagram of examples of the charge-pump circuit CP and the loop filter LPF. The charge-pump circuit CP includes a first current source I1 connected to a power supply VDD, a PMOS transistor P1, an NMOS transistor N2, and a second current source 12 connected to the ground GND. The PMOS transistor P1 becomes conductive in response to the first phase-difference signal (+1) generated by the phase comparator PFD, and outputs the current of the first current source I1 as the positive charge current I_push. On the other hand, the NMOS transistor N2 becomes conductive in response to the second phase-difference signal (−1) generated by the phase comparator PFD, and outputs the current of the second current source 12 as the negative charge current I_pull.

For enabling the PMOS transistor P1 and the NMOS transistor N2 to perform the operations described above, the first phase-difference signal (+1) is provided, via a logic circuit not illustrated, to the gate of the PMOS transistor P1 as a L level signal for making the same conductive, and also the second phase-difference signal (−1) is provided, via a logic circuit, to the gate of the NMOS transistor N2 as a H level signal for making the same conductive.

The loop filter LPF illustrated in FIG. 3, is a three-order CR circuit, which includes a first-order CR circuit having a resistor R1 and a capacitor C1, a second-order CR circuit having capacitor C2, and a third CR circuit having a resistor R2 and a capacitor C3. The loop filter LPF is a CR circuit which charges the positive charge current I_push and the negative charge current I_pull, which the charge-pump circuit CP generates, to the capacitors C1, C2, and C3. That is, if the positive charge current I_push is generated for a long period of time, the voltage of the control voltage Vc as an output of the loop filter LPF rises, and, on the contrary, if the negative charge current I_pull is generated for a long period of time, the voltage of the control voltage Vc drops.

If a conventional PLL is implemented in an LSI chip, it is preferred to decrease the charge current and size down the RLC elements of the loop filter LPF and the voltage controlled oscillator VCO. Decrease of the charge current causes an increase of an unbalance between the positive charge current and the negative charge current within the charge pump CP. Such the unbalance between the charge currents, coupled with reduction of the resistance and the capacitance of the loop filter LPF, causes an increase of variability of the control voltage Vc generated by the loop filter LPF, and thus increases the jitter of the output clock Out_clk. Also, in an LSI chip, the characteristics of the loop filter and the voltage oscillator become non-linear differing from the ideal linear characteristic, and such non-linear characteristic causes jitter of the output clock Out_clk.

Therefore, the PLL in accordance with the present embodiment includes a charge pump CP constituted by an equalizer or the like, and the characteristic of the equalizer is controlled by weighting coefficients A, Ax. By these weighting coefficients A, Ax, the characteristic of the charge-pump equalizer CP is controlled, and unbalance between the charge currents of the charge pump CP and the non-linear characteristics of the loop filter LPF and the oscillator VCO are canceled. In other words, the charge pump CP constituted by an equalizer is made to have an opposite characteristic so as to cancel the difference of characteristics of the charge pump, the loop filter LPF, and the voltage controlled oscillator VCO in the PLL loop from the ideal characteristics thereof, thereby jitter of the output clock Out_clk is suppressed. For example, as described below, by the weighting coefficients A, Ax, the frequency characteristic of the equalizer of the charge pump is controlled.

As illustrated in FIG. 1, the PLL in accordance with the present embodiment includes: a replica circuit 10, which includes a digital filter having ideal characteristics of the loop filter and the voltage controlled oscillator, inputting a phase difference digital value having the phase difference of the phase-difference signal Pe, and generating a replica output according to the ideal characteristic, and outputs the difference signal Dout between the replica output and the ideal output; and a coefficient generating circuit 20, which generates weighting coefficients A, Ax from the difference signal Dout.

Figure 4:
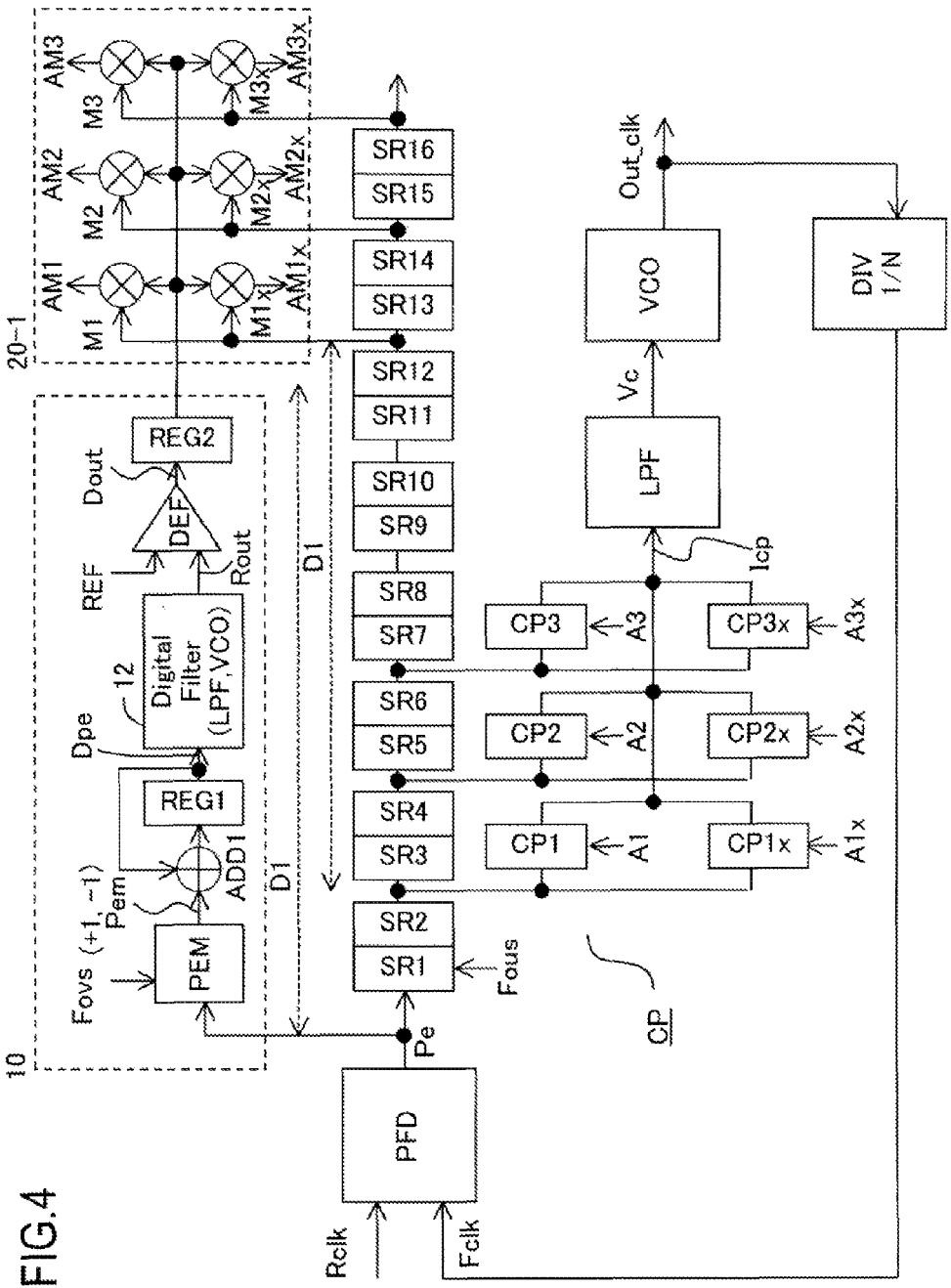
FIG. 4 is a detailed configuration diagram of the PLL in accordance with an embodiment.
Figure 5:
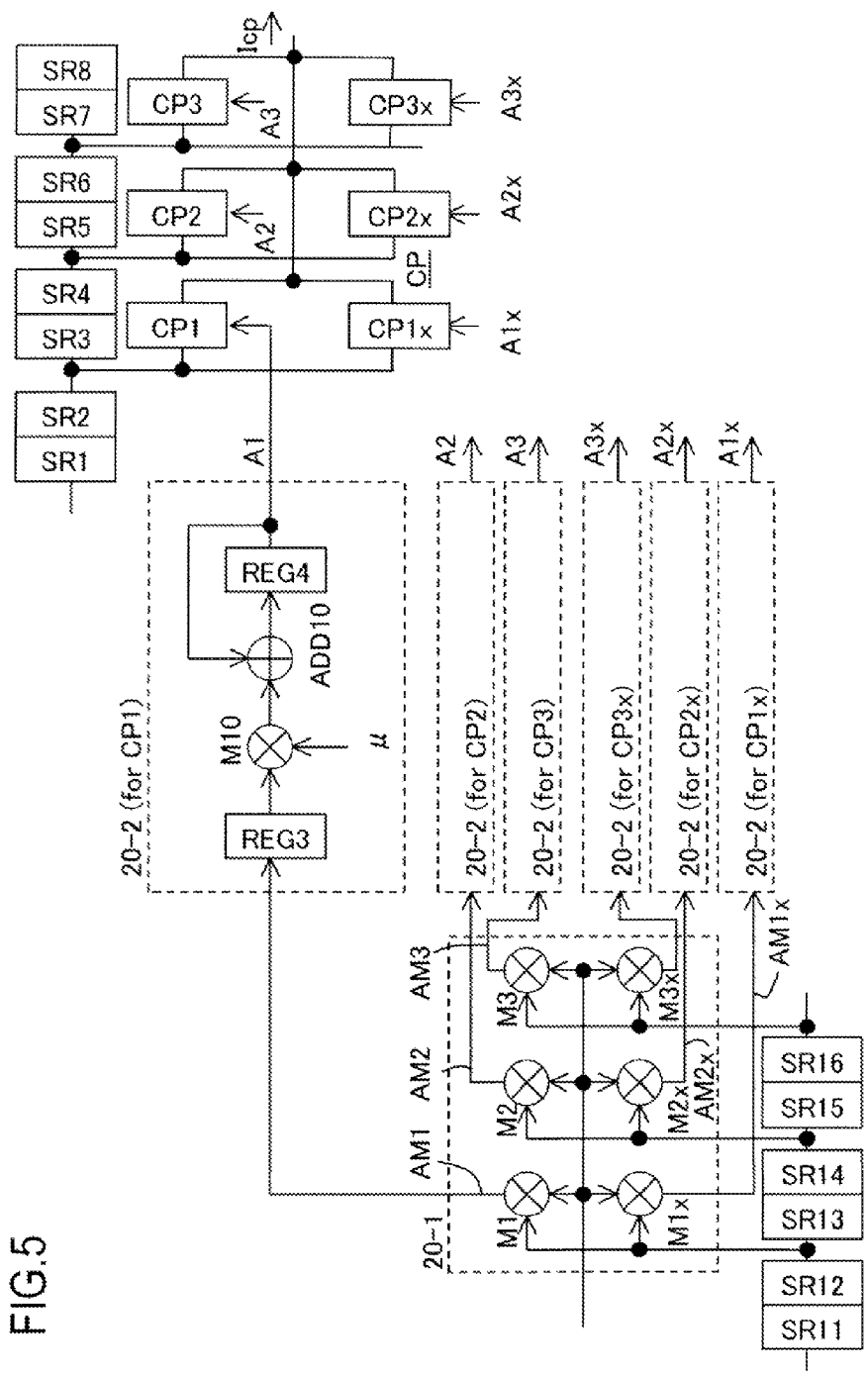
FIG. 5 is a circuit diagram of circuits 20-1, 20-2 constituting a coefficient generating circuit 20.

FIG. 4 is a detailed configuration diagram of the PLL in accordance with the present embodiment. Also, FIG. 5 is a circuit diagram illustrating a unit 20-2, which is a part of the coefficient generating circuit 20 of the PLL in accordance with the present embodiment. A coefficient generating circuit is constituted by the coefficient generating circuit 20-1 of FIG. 4 and a circuit 20-2 of FIG. 5.

In the PLL in accordance with the present embodiment, the charge pump CP has three first charge pumps CP1, CP2, and CP3, each of which generates positive charge current, and three second charge pumps CP1x, CP2x, and CP3x, each of which generates negative charge current. Further, the charge pump CP has shift registers SR1-SR6 constituting a delay circuit, and the delay circuit delays signals of "+1" or "−1", which are obtained by sampling the phase-difference signal Pe according to an over-sampling clock Fovs. These shift registers SR1-SR6 delay the sampling signals "+1" and "−1" of the phase-difference signal Pe in sync with a system clock, which is not illustrated, and provides the signals to three sets of the first and the second charge pumps CP1, CP1x-CP3, CP3x at different delay timings.

The first charge pumps CP1, CP2, and CP3 are constituted by the first current source I1 connected to the source voltage VDD and the PMOS transistor P1, as illustrated in FIG. 3. Similarly, the second charge pumps CP1x, CP2x, and CP3x are constituted by the second current source I2 connected to the ground and the NMOS transistor N1, as illustrated in FIG. 3. Therefore, the PMOS transistors P1 within the first charge pumps CP1, CP2, and CP3 become conductive when the phase-difference signal Pe, which is late provided, is "+1", and outputs the push current of the first current source I1. Similarly, the NMOS transistors N2 within the second charge pumps CP1x, CP2x, and CP3x become conductive when the phase-difference signal Pe, which is late provided, is "−1", and outputs the pull current of the second current source I2.

Further, current values of the first charge pumps CP1, CP2, and CP3 are respectively weighted according to weighting coefficients A1, A2, and A3 provided from the coefficient generating circuit 20 illustrated as 20-1 in FIG. 4 and as 20-2 in FIG. 5. That is, current values of the first current supplies I1 within the first charge pumps CP1, CP2, and CP3 are variably controlled respectively according to the weighting coefficients A1, A2, and A3. Similarly, current values of the second charge pumps CP1x, CP2x, and CP3x are weighted respectively according to weighting coefficients A1x, A2x, and A3x from the coefficient generating circuit 20, and current values of the second current supplies 12 are variably controlled respectively according to the weighting coefficients A1x, A2x, and A3x.

Then, the push current, which is positive charge current generated by the first charge pumps CP1, CP2, and CP3, and the pull current, which negative charge current generated by the second charge pumps CP1x, CP2x, and CPx3 are added at the line connections, and the added current Icp is provided to the loop filter LPF.

The charge pump CP configured as the above is considered as a transversal FIR filter constituting the equalizer. The transversal FIR filter delays input signals, multiplies the input signals, which are delayed by different times, by respective tap coefficients by a plurality of multipliers, and adds up the multiplication results. That is, the shift registers, as a delay circuit, are considered to generate delay signals as an output of the delay tap of a FIR filter. Further, the weighting coefficients A, Ax controlling current value are considered to be the tap coefficients of the multipliers of the FIR filter. Also, adding up each current of the charge pumps CP1, CP2, and CP3 is considered to be as an adder of the FIR filter. Hence, the characteristic of the charge-pump equalizer is controlled to be a preferable characteristic by the weighting coefficients.

The loop filter LPF integrates the added charge currents by the CR circuits as illustrated in FIG. 3 and generates the control voltage Vc. The voltage controlled oscillator VCO controls, according to the control voltage Vc, oscillating frequency thereof and generates the output clock Out_clk.

The PLL in accordance with the present embodiment has the replica circuit 10. The replica circuit 10 includes a pulse-burst signal generating unit PEM and an integrator having the adder ADD1 and the register REG1, and, by these circuits, converts the phase-difference signal Pe into the digital phase-difference signal Dpe, in which the phase difference of Pe is digitized.

Figure 6:
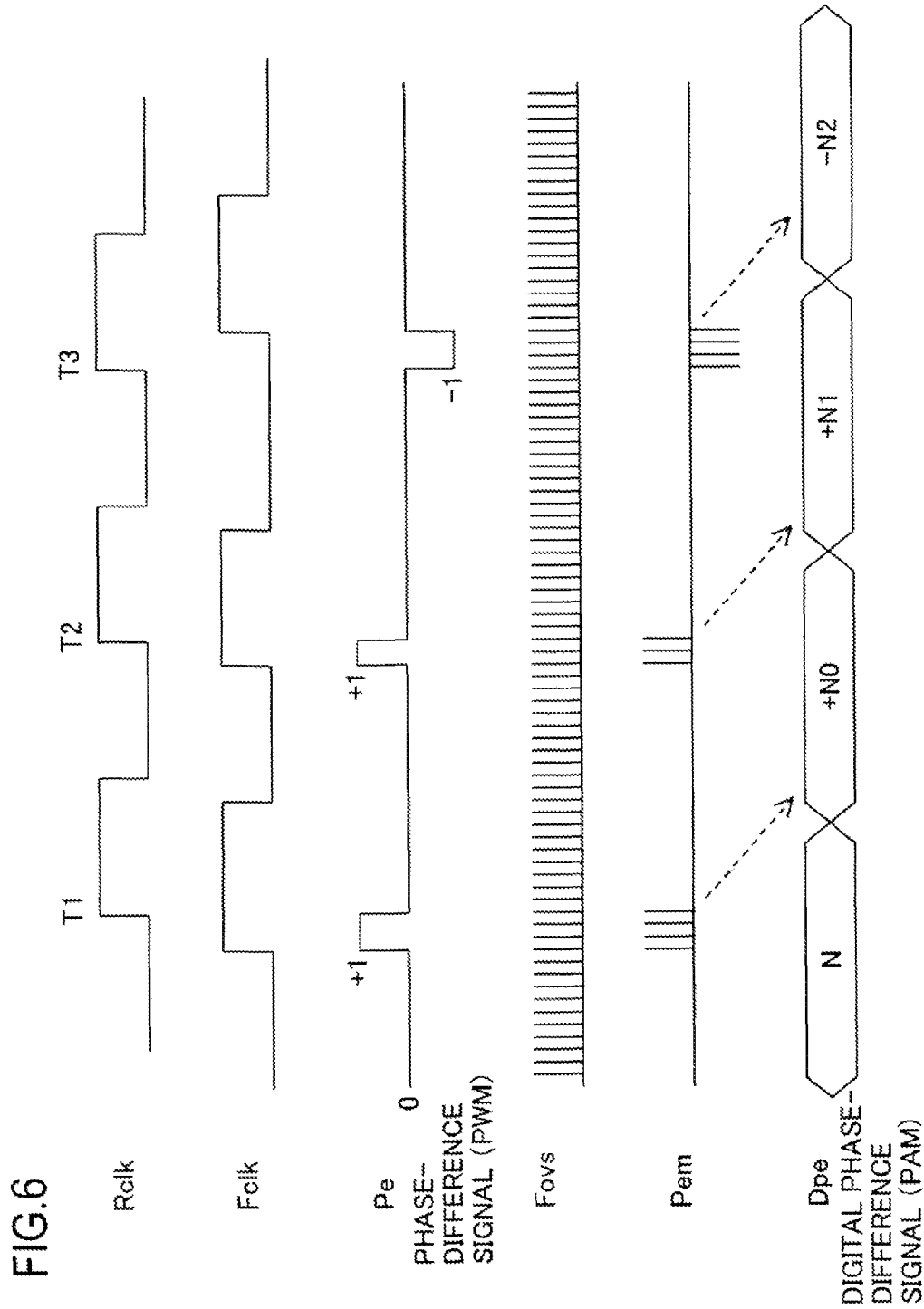
FIG. 6 illustrates behaviors of a pulse burst signal generating unit PEM and an integrators ADD, REG1.

FIG. 6 illustrates an operation of a pulse burst signal generating unit PEM and integrators ADD1, REG1. Relation among the reference clock Rclk, the feedback clock Fclk, and the phase-difference signal Pe of FIG. 6 is the same as that of FIG. 2A. The pulse burst signal generating unit PEM generates a pulse burst signal Pem by logical product of the values of the phase-difference signal Pe, that is, "+1", "0", and "−1", and the over-sampling clock Fovs. That is, at the times T1, T2, pulses of "+1" of the phase-difference signal Pe are converted into the pulse burst signal Pem having a sequence of pulses of "+1" during the pulse widths of the phase-difference signal Pe. On the contrary, at the time T3, pulses of "−1" of the phase-difference signal Pe are converted into the pulse burst signal Pem having a sequence of pulses of "−1" during the pulse widths of the phase-difference signal Pe.

Then, the integrator having the adder ADD1 and the register REG1 integrates the pulse burst signal Pem, by the register REG1 delaying the result of addition by 1 clock, and the adder ADD1 adding the result of addition to the subsequent burst pulse Pem. As a result, the digital phase-difference signal Dpe becomes a signal indicating the pulse width of the phase-difference signal Pe in digital values. In other words, a PWM signal indicating the phase difference by the pulse width is considered to be converted into a PAM signal indicating the phase difference by amplitude values.

On the other hand, the charge pump CP within the PLL loop has a conversion characteristic K for converting the pulse width of the phase-difference signal Pe into the charge current. Therefore, the above described digital phase-difference signal Dpe corresponds to the charge current generated and input into the loop filter LPF by the charge pump CP.

The replica circuit 10 includes a digital filter 12 having an ideal transfer characteristic lpf(S) of the loop filter LPF and an ideal transfer characteristic 1/S of the voltage control oscillator VCO. That is, the digital filter 12 has ideal, for example, linear, transfer characteristics of the loop filter LPF and the voltage controlled oscillator VCO within the PLL loop. Here, transfer characteristic lpf(S) is so called S function, which is replaceable with Z function lpk(z), in the digital filter 12. Also, the transfer function 1/S is a function of the integrator function, which is also replaceable with Z function 1/Z, in the digital filter 12.

This digital filter 12 is constituted by a transversal FIR filter, which can control the transfer characteristic to be an arbitrary characteristic according to the tap coefficients, for example.

The digital filter 12 input in the digital phase-difference signal Dpe, and, according to an ideal transfer characteristic, generates a digital replica output Rout corresponding to the frequency of the output clock Out_clk or the control voltage Vc. The replica output Rout has, for example, an appropriate 8-bit or 10-bit resolution.

The replica circuit 10 further includes a differential circuit DEF, such that the differential circuit DEF outputs a difference (error) value Dout between the digital replica output Rout and a reference value REF corresponding to the frequency according to the reference clock Rclk or the control voltage. This reference value REF is, thus, an ideal value. This digital difference value Dout is latched by the register REG2.

As the above, from the digital value Dpe indicating the pulse width (the phase difference) of the phase-difference signal Pe having jitter (fluctuation of phase) of the output clock Out_clk generated by the PLL loop, the replica circuit 10 generates the digital replica output Rout corresponding to the frequency of the output clock Out_clk or the control voltage Vc within the PLL loop, by the digital filter 12 having an ideal transfer characteristics of LPF and VCO. That is, the replica output Rout is a replication of the frequency of the output clock Out_clk or of the control voltage Vc, which are difficult to be monitored within the PLL loop.

The coefficient generating circuits 20-1, 20-2 generate weighting coefficients A1, A1x, A2, A2x, A3, and A3x of the charge-pump equalizer CP, according to the difference value Dout between this replica output Rout and the reference value REF. The coefficient generating circuit 20-1 includes multipliers M1, M1x, M2, M2x, M3, and M3x, which determine correlation values between the difference Dout and the phase-difference signal Pe delayed until the timing the difference Dout is generated. The delay given to phase-difference signal Pe is generated by the shift registers SR3-SR16 constituting the delay circuit. That is, a delay time D1 from the input to the output of replica circuit 10 is equal to the delay time D1 from the output of the shift register SR2, which provides the charge pumps CP1, CP1x with the phase-difference signal Pe, to the output of the shift register SR12, which provides the multipliers M1, M1x with the phase-difference signal Pe. As for the other charge pumps CP2, CP2x, CP3, and CP3x and multipliers M2, M2x, M3, and M3x, the delay time from the output of the shift registers SR4, SR6, which provides each thereof with the phase-difference signal Pe, to the output of the shift registers SR14, SR15 is also D1.

The correlation values determined by these multipliers are differences Dout, among differences Dout output from the replica circuit 10, which strongly correlate to the phase-difference signal Pe causing the difference. Then, the coefficient generating circuit 20 integrates, with a prescribed attenuation ratio, the correlation values AM1, AM1x, AM2, AM2x, AM3, and AM3x determined by the multipliers, and generates weighting coefficients A1, A1x, A2, A2x, A3, and A3x respectively given to the charge pumps CP1, CP1x, CP2, CP2x, CP3, and CP3x.

FIG. 5 is a circuit diagram of circuits 20-1 and 20-2 constituting the coefficient generating circuit 20. The circuit 20-1 and the charge-pump equalizer CP in FIG. 5 are the same as in FIG. 4. The circuits 20-2 are implemented between outputs of the multipliers M1-M3x of the coefficient generating circuit 20-1 and the charge pumps CP1-CP3x respectively. The circuit 20-2 has a register REG3 which latches correlation values AM1-AM3x determined by the multipliers M1-M3x, a multiplier M10 which multiplies to the correlation values AM1-AM3 an attenuation ratio µ, an adder ADD10, and a register REG4 which delays the result of addition by one clock. By this circuit 20-2, the correlation values AM1-AM3x determined by the multipliers M1-M3x of the coefficient generating circuit 20-1 are attenuated at the multiplier M10 with the attenuation ratio µ, then integrated by an integrator having the adder ADD10 and the register REG4, and, thus, the weighting coefficients A1-A3x are generated.

Therefore, the weighting coefficients A1-A3x correspond to smoothes values that the circuit 20-2 generates by cutting high frequency of the correlation values AM1-AM3x to smooth the same.

The weighting coefficients A1-A3x determined by the coefficient generating circuit 20 are negatively fed-back respectively to the charge pumps CP1-CP3x, and, according to the weighting coefficients, the charge currents of the charge pumps are variably controlled. Since the weighting coefficients are negatively fed-back, the charge-pump equalizer CP generates an addition current Icp so that the difference Dout becomes zero. For example, the variable control of current value by the weighting coefficients at the charge-pump equalizer is performed to obtain such current value that, as the weighting coefficients increases, the jitter of the control voltage Vc or the output clock Out_clk decreases. As a result, the output clock Out_clk generated by the PLL loop merges to the output clock having an ideal frequency and phase which are phase-locked to the reference clock Rclk.

That is, unbalance of the charge current of the charge pump CP and the non-linear transfer characteristics of the loop filter LPF and the voltage controlled oscillator VCO are corrected by the transfer characteristic of the charge-pump equalizer CP. And thus the charge current of the charge pump is balanced. Hence, it is enabled to generate the output clock Out_clk having the frequency and the phase which are supposed to be generated by a PLL loop having the loop filter LPF and oscillator VCO with a linear transfer characteristics.

Figure 7:
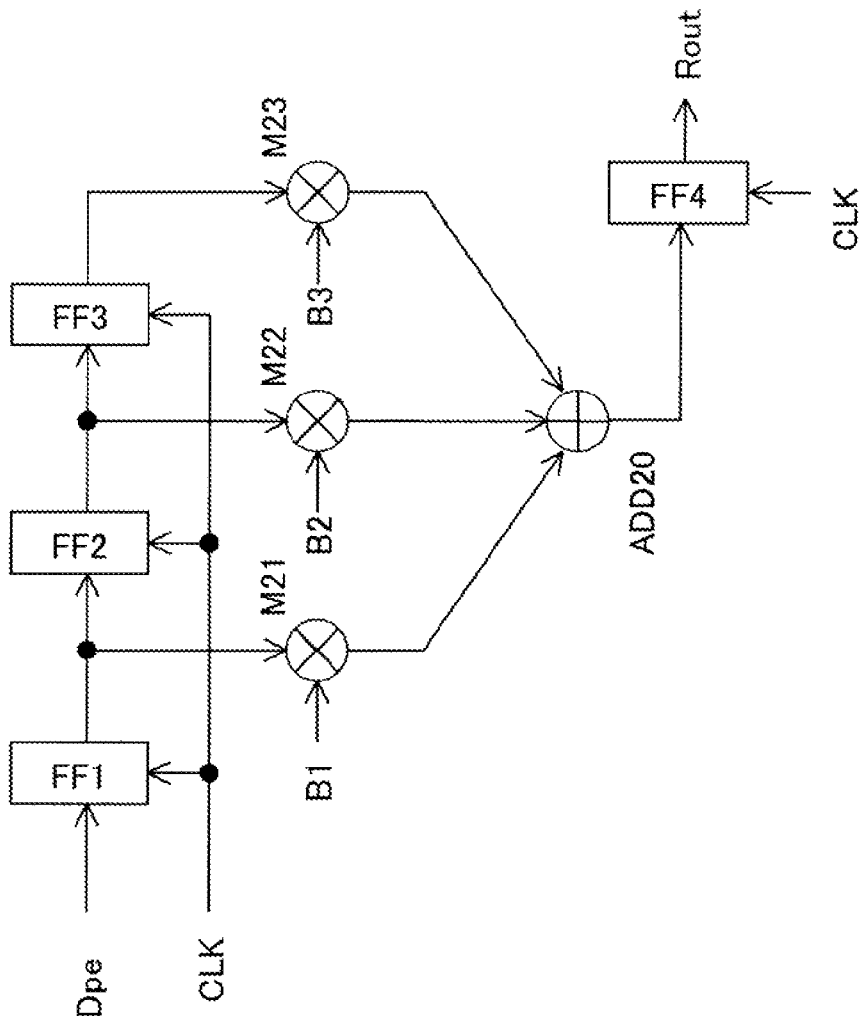
FIG. 7 illustrates a circuit example of a digital filter.

FIG. 7 illustrates an example of a circuit of a digital filter. The digital filter 12 may be implemented as a transversal FIR filter as illustrated in FIG. 7. This FIR filter includes three flip-flops FF1, FF2, and FF3 which delay the input digital difference signal Dpe by the clock CLK, multipliers M21, M22, and M23 which respectively multiply the delayed difference signals Dpe by the tap coefficients B1, B2, and B3, an adder ADD20 which adds up the outputs of the multipliers, and a flip-flop FF4 which latches, in sync with the clock CLK, the addition output by the adder ADD20. The replica output Rout is output from the flip-flop FF4. The above three delay flip-flops and three multipliers are for illustrative purpose, and there may be larger number of flip-flops and multipliers implemented.

Then, by appropriately setting the tap coefficients B1, B2, and B3, the transfer characteristic of the digital filter 12 may be set to be an arbitrary characteristic. As explained by FIG. 4, the digital filter 12 has the ideal transfer characteristic lpf(Z) of the filter LPF and the ideal transfer characteristic 1/Z of the voltage controlled oscillator VCO.

As the above, in the PLL in accordance with the present embodiment, the charge pump CP is constituted by an equalizer, the replica circuit 10 generates frequency data of the output clock corresponding to the phase-difference signal Pe, and the transfer characteristic of the charge-pump equalizer is controlled so that the difference between the frequency data and the ideal frequency data becomes zero. Therefore, even if the PLL is implemented in an LSI chip, it is enabled to generate the clock Out_clk which is faster and with little jitter.

The PLL in accordance with the present embodiment suppresses jitter occurring at the output clock due to the unbalance caused by production variable and due to the non-linear characteristics of analog circuits, such as the charge pump within the PLL loop, the loop filter, and the voltage controlled oscillator, by means of a digital replica circuit and a coefficient generating circuit which are insusceptible to the manufacturing variation, and a charge-pump equalizer of which transfer characteristic may be controlled to suppress the jitter by coefficients thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

What is claimed is:

1. A Phase Lock Loop (PLL) comprising:
A phase comparator which compares phases of a reference clock and a feedback clock and outputs phase-difference signal;
a charge-pump equalizer, which includes a plurality of charge pumps, the plurality of charge pumps generating charge currents according to phase-difference signals, each being generated by delaying the phase-difference signal by different times, adds the charge currents generated by the plurality of charge pumps, and outputs the added charge current;
a loop filter which generates a control voltage according to the charge current;
a voltage controlled oscillator which generates an output clock having a frequency corresponding to the control voltage;
a divider which divides the output clock to generate the feedback clock;
a replica circuit, which includes a digital filter, the digital filter having ideal characteristics of the loop filter and the voltage controlled oscillator, inputting in a phase-difference digital value having phase difference of the phase-difference signal, and generating a replica output according to the ideal characteristics, and outputs a difference signal based on the replica output and an ideal value; and
a coefficient generating circuit which smoothes correlation values of the difference signal and the phase-difference signal to generate charge pump coefficients, and negatively feeds back the charge pump coefficients to the plurality of charge pumps respectively, wherein the plurality of charge pumps generate the charge currents each having current value corresponding to each of the charge pump coefficients.

2. The PLL according to claim 1, wherein
the phase-difference signal includes a first phase-difference signal, which has a first value for the time of the phase difference, in a first case that phase of the reference clock leads or retards behind phase of the feedback clock, and a second phase-difference signal, which has a second value for the time of the phase difference, in a second case which is opposite to the first case,
each of the plurality of the charge pumps in the charge-pump equalizer includes a first charge pump which generates a positive charge current according to the first phase-difference signal and a second charge pump which generates a negative charge current according to the second phase-difference signal, and
the charge-pump equalizer adds and outputs the positive and negative charge currents of the plurality of the charge pumps.

3. The PLL according to claim 2, wherein
the coefficient generating circuit includes a correlation value generating circuit for generating the correlation values corresponding to correlation between the difference signal and the phase-difference signal at a corresponding time thereto.

4. The PLL according to claim 3, wherein
the correlation value generating circuit includes a plurality of first and second multipliers each of which multiples the difference signal and the phase-difference signal at a corresponding time thereto, and a plurality of first and second smoothing circuits each of which respectively smoothes outputs of the first and the second multipliers, with respect to the plurality of the first and the second charge pumps of the plurality of the charge pumps, and outputs of the plurality of the first and the second smoothing circuits are respectively negatively fed back, as weighting coefficients, to the plurality of the first and the second charge pumps.

5. The PLL according to claim 4, further comprising:
a first delay circuit which delays the phase-difference signal and provides phase-difference signals with different delay times respectively to the plurality of the charge pumps, and
a second delay circuit which delays the phase-difference signals with the different delay times by delay time of the replica circuit and provides the same to the plurality of the first and the second multipliers.

6. The PLL according to claim 4, wherein
each of the first and the second smoothing circuits multiplies the outputs of the multipliers by an attenuation coefficient and integrates the multiplied values.

7. The PLL according to claim 2, wherein
the replica circuit further includes an integrator which integrates a first value of the first phase-difference signal and a second value of the second phase-difference signal in sync with an over-sample clock to generate the phase difference digital value, and a difference circuit which generates the difference signal between the replica output and the ideal output.

8. The PLL according to claim 1, wherein
the digital filter includes a FIR filter having a plurality of filter multipliers which multiply a plurality of delay input signals, which are obtained by delaying input signals by different times, by tap coefficients respectively, and an adder, which adds outputs of the plurality of filter multipliers.

9. The PLL according to claim 2, wherein
the first charge pump includes a PMOS transistor which is connected to a power supply voltage and generates the positive charge current,
the second charge pump includes a NMOS transistor which is connected to a ground and generates the negative charge current, and
in each of the plurality of the charge pumps, the PMOS transistor and the NMOS transistor is connected so that the positive and the negative charge currents are added.

10. The PLL according to claim 2, wherein
the loop filter includes a CR filter which integrates the added charge currents.

11. The PLL according to claim 2, wherein the voltage controlled oscillator includes an LC oscillator, of which a capacitance is variably controlled according to the control voltage.

* * * * *